United States Patent
Kozicki

(10) Patent No.: US 8,742,531 B2
(45) Date of Patent: Jun. 3, 2014

(54) ELECTRICAL DEVICES INCLUDING DENDRITIC METAL ELECTRODES

(75) Inventor: Michael Kozicki, Phoenix, AZ (US)

(73) Assignee: Arizona Board of Regents, Acting for and on Behalf of Arizona State University, Scottsdale, AZ (US)

( * ) Notice: Subject to any disclaimer, the term of this patent is extended or adjusted under 35 U.S.C. 154(b) by 348 days.

(21) Appl. No.: 13/129,647

(22) PCT Filed: Dec. 8, 2009

(86) PCT No.: PCT/US2009/067077
§ 371 (c)(1),
(2), (4) Date: Jul. 7, 2011

(87) PCT Pub. No.: WO2010/077622
PCT Pub. Date: Jul. 8, 2010

(65) Prior Publication Data
US 2011/0254117 A1    Oct. 20, 2011

Related U.S. Application Data

(60) Provisional application No. 61/120,747, filed on Dec. 8, 2008.

(51) Int. Cl.
*H01L 31/06* (2012.01)

(52) U.S. Cl.
USPC .......................... 257/461; 257/773; 438/468

(58) Field of Classification Search
CPC ...... H01L 23/48; H01L 31/102; H01L 21/326
USPC ................................. 257/461, 773; 438/468
See application file for complete search history.

(56) References Cited

U.S. PATENT DOCUMENTS

| | | | | |
|---|---|---|---|---|
| 3,615,831 A | * | 10/1971 | Ruben | 429/204 |
| 3,904,453 A | * | 9/1975 | Revesz et al. | 438/72 |
| 3,949,463 A | * | 4/1976 | Lindmayer et al. | 438/72 |
| 4,158,807 A | | 6/1979 | Senturia | |
| 4,317,084 A | * | 2/1982 | Senturia et al. | 331/57 |
| 4,320,250 A | * | 3/1982 | Corwin et al. | 136/256 |
| 4,586,988 A | * | 5/1986 | Nath et al. | 205/123 |
| 4,590,327 A | * | 5/1986 | Nath et al. | 136/256 |

(Continued)

FOREIGN PATENT DOCUMENTS

WO    98/48319         10/1998
WO    2007/102988 A2    9/2007

OTHER PUBLICATIONS

Seok-Soon Kim, Electrodeposited Pt for cost-efficient and flexible dye-sensitized solar cells, Electrochimica Acta 51 (2006) 3814-3819.*

(Continued)

*Primary Examiner* — Kimberly Rizkallah
*Assistant Examiner* — Caleb Henry
(74) *Attorney, Agent, or Firm* — McDonnell Boehnen Hulbert & Berghoff LLP

(57) ABSTRACT

The present invention relates generally to electrical devices. The present invention relates more particularly to electrical devices including dendritic metal electrodes. One aspect of the present invention is an electrical device comprising a first electrode comprising at least one dendritic metal structure; a second electrode; and an electrically active structure disposed between the dendritic metal structure and the second electrode.

16 Claims, 8 Drawing Sheets

(56) References Cited

U.S. PATENT DOCUMENTS

| | | | |
|---|---|---|---|
| 4,633,033 A * | 12/1986 | Nath et al. | 136/256 |
| 4,633,034 A * | 12/1986 | Nath et al. | 136/256 |
| 4,697,041 A * | 9/1987 | Okaniwa et al. | 136/244 |
| 4,724,010 A * | 2/1988 | Okaniwa et al. | 136/246 |
| 4,888,062 A * | 12/1989 | Nakagawa et al. | 136/258 |
| 4,918,507 A * | 4/1990 | Yoshida | 257/459 |
| 4,926,229 A * | 5/1990 | Nakagawa et al. | 136/265 |
| 4,936,924 A * | 6/1990 | Inuzuka | 136/249 |
| 4,959,106 A * | 9/1990 | Nakagawa et al. | 136/258 |
| 4,971,832 A * | 11/1990 | Arai et al. | 427/575 |
| 5,002,618 A * | 3/1991 | Kanai et al. | 136/258 |
| 5,006,180 A * | 4/1991 | Kanai et al. | 136/258 |
| 5,007,971 A * | 4/1991 | Kanai et al. | 136/258 |
| 5,008,726 A * | 4/1991 | Nakagawa et al. | 257/458 |
| 5,017,243 A * | 5/1991 | Otsubo | 136/244 |
| 5,024,706 A * | 6/1991 | Kanai et al. | 136/258 |
| 5,073,520 A * | 12/1991 | Yoshida | 438/93 |
| 5,142,331 A * | 8/1992 | Yoshida | 257/464 |
| 5,220,181 A * | 6/1993 | Kanai et al. | 257/40 |
| 5,244,509 A * | 9/1993 | Arao et al. | 136/259 |
| 5,296,043 A * | 3/1994 | Kawakami et al. | 136/244 |
| 5,324,364 A * | 6/1994 | Matsuda et al. | 136/249 |
| 5,344,498 A * | 9/1994 | Inoue | 136/251 |
| 5,380,371 A * | 1/1995 | Murakami | 136/256 |
| 5,391,235 A * | 2/1995 | Inoue | 136/244 |
| 5,453,135 A * | 9/1995 | Nakagawa et al. | 136/259 |
| 5,477,088 A * | 12/1995 | Rockett et al. | 257/764 |
| 5,486,238 A * | 1/1996 | Nakagawa et al. | 136/259 |
| 5,500,055 A * | 3/1996 | Toyama et al. | 136/259 |
| 5,527,717 A * | 6/1996 | Inoue | 438/64 |
| 5,530,264 A * | 6/1996 | Kataoka et al. | 257/40 |
| 5,573,601 A * | 11/1996 | Saitoh et al. | 136/258 |
| 5,589,403 A * | 12/1996 | Toyama et al. | 438/71 |
| 5,599,403 A * | 2/1997 | Kariya et al. | 136/258 |
| 5,603,778 A * | 2/1997 | Sonoda | 136/259 |
| 5,620,530 A * | 4/1997 | Nakayama | 136/259 |
| 5,660,646 A * | 8/1997 | Kataoka et al. | 136/251 |
| 5,667,596 A * | 9/1997 | Tsuzuki et al. | 136/256 |
| 5,679,176 A * | 10/1997 | Tsuzuki et al. | 136/251 |
| 5,681,402 A * | 10/1997 | Ichinose et al. | 136/256 |
| 5,716,480 A * | 2/1998 | Matsuyama et al. | 136/249 |
| 5,761,115 A * | 6/1998 | Kozicki et al. | 365/182 |
| 5,837,119 A * | 11/1998 | Kang et al. | 205/74 |
| 5,896,312 A | 4/1999 | Kozicki et al. | |
| 5,914,893 A | 6/1999 | Kozicki et al. | |
| 6,184,456 B1 * | 2/2001 | Matsuyama et al. | 136/256 |
| 6,204,443 B1 * | 3/2001 | Kiso et al. | 136/259 |
| 6,258,702 B1 * | 7/2001 | Nakagawa et al. | 438/570 |
| 6,388,324 B2 | 5/2002 | Kozicki | |
| 6,418,049 B1 | 7/2002 | Kozicki et al. | |
| 6,447,879 B1 * | 9/2002 | Sakurai et al. | 428/161 |
| 6,469,364 B1 | 10/2002 | Kozicki | |
| 6,472,594 B1 * | 10/2002 | Ichinose et al. | 136/256 |
| 6,487,106 B1 | 11/2002 | Kozicki | |
| 6,515,216 B2 * | 2/2003 | Zenko et al. | 136/244 |
| 6,559,479 B1 * | 5/2003 | Ludemann | 257/99 |
| 6,635,914 B2 | 10/2003 | Kozicki et al. | |
| 6,689,951 B2 * | 2/2004 | Shimizu et al. | 136/256 |
| 6,710,239 B2 * | 3/2004 | Tanaka | 136/244 |
| 6,759,586 B2 * | 7/2004 | Shutoh et al. | 136/205 |
| 6,783,796 B2 * | 8/2004 | Sakurai et al. | 427/58 |
| 6,798,692 B2 | 9/2004 | Kozicki et al. | |
| 6,825,489 B2 | 11/2004 | Kozicki | |
| 6,865,117 B2 | 3/2005 | Kozicki | |
| 6,914,802 B2 | 7/2005 | Kozicki | |
| 6,927,411 B2 | 8/2005 | Kozicki | |
| 6,940,745 B2 | 9/2005 | Kozicki | |
| 6,985,378 B2 | 1/2006 | Kozicki | |
| 6,998,312 B2 | 2/2006 | Kozicki et al. | |
| 7,006,376 B2 * | 2/2006 | Kozicki | 365/185.01 |
| 7,090,784 B2 * | 8/2006 | Asakawa et al. | 216/41 |
| 7,101,728 B2 | 9/2006 | Kozicki et al. | |
| 7,142,450 B2 | 11/2006 | Kozicki et al. | |
| 7,145,794 B2 | 12/2006 | Kozicki | |
| 7,164,150 B2 * | 1/2007 | Terakawa et al. | 257/52 |
| 7,169,635 B2 | 1/2007 | Kozicki | |
| 7,180,104 B2 | 2/2007 | Kozicki | |
| 7,214,872 B2 * | 5/2007 | Maruyama et al. | 136/258 |
| 7,227,169 B2 | 6/2007 | Kozicki | |
| 7,288,781 B2 | 10/2007 | Kozicki | |
| 7,294,875 B2 | 11/2007 | Kozicki | |
| 7,372,065 B2 | 5/2008 | Kozicki et al. | |
| 7,385,219 B2 | 6/2008 | Kozicki et al. | |
| 7,402,847 B2 | 7/2008 | Kozicki et al. | |
| 7,405,967 B2 | 7/2008 | Kozicki et al. | |
| 7,560,722 B2 | 7/2009 | Kozicki | |
| 7,605,328 B2 * | 10/2009 | Sager et al. | 136/265 |
| 7,663,057 B2 * | 2/2010 | Yu et al. | 136/264 |
| 7,675,766 B2 | 3/2010 | Kozicki | |
| 7,728,322 B2 | 6/2010 | Kozicki | |
| 7,763,158 B2 | 7/2010 | Kozicki | |
| 7,791,157 B2 * | 9/2010 | Cho et al. | 257/436 |
| 7,852,451 B2 * | 12/2010 | Kim et al. | 349/187 |
| 7,968,382 B2 * | 6/2011 | Jinbo et al. | 438/149 |
| 7,977,568 B2 * | 7/2011 | Korevaar et al. | 136/255 |
| 8,039,870 B2 * | 10/2011 | Burke et al. | 257/192 |
| 8,093,684 B2 * | 1/2012 | Nasuno et al. | 257/607 |
| 8,212,235 B2 * | 7/2012 | Wang et al. | 257/14 |
| 8,345,910 B2 | 1/2013 | Chae et al. | |
| 8,399,339 B2 * | 3/2013 | Lieber et al. | 438/478 |
| 2002/0084503 A1 * | 7/2002 | Lee et al. | 257/456 |
| 2002/0148499 A1 * | 10/2002 | Tanaka | 136/256 |
| 2003/0001229 A1 * | 1/2003 | Moore et al. | 257/528 |
| 2003/0087064 A1 * | 5/2003 | Sakurai et al. | 428/161 |
| 2003/0121228 A1 * | 7/2003 | Stoehr et al. | 52/518 |
| 2003/0178630 A1 * | 9/2003 | Maruyama | 257/98 |
| 2005/0028860 A1 * | 2/2005 | Sano et al. | 136/249 |
| 2005/0034755 A1 * | 2/2005 | Okada et al. | 136/256 |
| 2005/0194037 A1 * | 9/2005 | Asai | 136/256 |
| 2006/0065298 A1 * | 3/2006 | Nakashima et al. | 136/256 |
| 2006/0260673 A1 * | 11/2006 | Takeyama | 136/252 |
| 2006/0283496 A1 * | 12/2006 | Okamoto et al. | 136/244 |
| 2006/0289056 A1 * | 12/2006 | Gondo et al. | 136/263 |
| 2006/0289057 A1 * | 12/2006 | Gonda et al. | 136/263 |
| 2007/0006917 A1 * | 1/2007 | Gonda et al. | 136/263 |
| 2007/0059584 A1 * | 3/2007 | Nakano et al. | 429/40 |
| 2007/0163645 A1 * | 7/2007 | Gonda et al. | 136/263 |
| 2007/0194467 A1 * | 8/2007 | Yang et al. | 257/E23.155 |
| 2007/0275230 A1 | 11/2007 | Murphy et al. | |
| 2008/0092947 A1 * | 4/2008 | Lopatin et al. | 136/255 |
| 2008/0096291 A1 * | 4/2008 | Takai et al. | 438/7 |
| 2008/0096305 A1 * | 4/2008 | Takai et al. | 438/96 |
| 2008/0230115 A1 * | 9/2008 | Kannou et al. | 136/252 |
| 2008/0230116 A1 * | 9/2008 | Kannou et al. | 136/252 |
| 2008/0248189 A1 * | 10/2008 | Ohtsuka et al. | 427/58 |
| 2008/0248388 A1 * | 10/2008 | Ohtsuka et al. | 429/218.1 |
| 2009/0053398 A1 * | 2/2009 | Nakai et al. | 427/74 |
| 2009/0078250 A1 * | 3/2009 | Ishii | 126/704 |
| 2009/0117741 A1 * | 5/2009 | Heath et al. | 438/694 |
| 2009/0130380 A1 * | 5/2009 | Asakawa et al. | 428/116 |
| 2009/0142558 A1 * | 6/2009 | Jiao et al. | 428/206 |
| 2009/0146178 A1 * | 6/2009 | Miyachi et al. | 257/184 |
| 2009/0189146 A1 * | 7/2009 | Burke et al. | 257/24 |
| 2009/0250619 A1 * | 10/2009 | Nakamura | 250/370.09 |
| 2010/0042389 A1 * | 2/2010 | Farruggia et al. | 703/6 |
| 2010/0109473 A1 * | 5/2010 | Peterson | 310/306 |
| 2010/0326503 A1 * | 12/2010 | Wang et al. | 136/255 |
| 2011/0248291 A1 * | 10/2011 | Jinbo et al. | 257/88 |
| 2012/0273781 A1 * | 11/2012 | Burke et al. | 257/48 |

OTHER PUBLICATIONS

Qin Zhou, Synthesis of highly crystalline silver dendrites microscale nanostructures by electrodeposition, Materials Letters 60 (2006) 3789-3792.*

Sreejith Kaniyankandy, Electrodeposition of silver nanodendrites, Nanotechnology 18 (2007) 125610 (6pp).*

Haoquan Yan, Dendritic Nanowire Ultraviolet Laser Array, J. Am. Chem. Soc. 9 vol. 125, No. 16, 2003 4728 and 4729.*

Rainer Waser, Nanoionics-based resistive switching memories, nature materials | vol. 6 | Nov. 2007, pp. 833-840.*

(56) References Cited

OTHER PUBLICATIONS

R. D. Naybour, The Effect of Electrolyte Flow on the Morphology of Zinc Electrodeposited from Aqueous Alkaline Solution Containing Zincate Ions, J. Electrochem. Soc.: Electrochemical Technology, 1960, pp. 520-524.*

Heer et al, Single-chip Microelectronic System to Interface with Living Cells, Biosensors and Bioelectronics, vol. 22, No. 11, pp. 2546-3553 (2007).

Kozicki et al., Nanostrcuture of solid electrolytes and surface electrodeposits, Physica E, vol. 19, No. 1-2, pp. 161-166 (2003).

Kozicki et al., Electrodeposit formation in solid electrolytes, 7th Annual Non-Volatile Memory Technology Symposium, pp. 111-115 (2006).

Balakrishnan et al., A low power non-volatile memory element based on copper in deposited silicon oxide, 7th Annual Non-Volatile Memory Technology Symposium, pp. 104-110 (2006).

* cited by examiner

"Open" - no electrodes between two widely-spaced bus bars

"Split fingers" - bus bars and fingers but with a gap in the fingers

"Interdigitated fingers" - bus bars and non-bridging fingers

ELECTRICAL DEVICES INCLUDING DENDRITIC METAL ELECTRODES

CROSS REFERENCE TO RELATED APPLICATIONS

The present application claims priority to U.S. Provisional Patent Application Ser. No. 61/120,747, filed Dec. 8, 2008, which is hereby incorporated by reference in its entirety.

BACKGROUND OF THE INVENTION

1. Field of the Invention

The present invention relates generally to electrical devices. The present invention relates more particularly to electrical devices including dendritic metal electrodes.

2. Technical Background

Electrically active structures find use in a variety of applications. One type of electrically active structure is a current generating structure, in which current is generated in response to an external stimulus. For example, solar cells are based on structures that generate current in response to absorption of solar radiation. This current can be collected to provide electrical energy. Similarly, optical sensors such as photodetectors can be based on current generating structures; absorption of an optical signal can generate current, which is electrically detected and can be correlated with an external stimulus. One type of common current generating structure is a p-n junction formed from a layer of p-type semiconductor in contact with a layer of n-type semiconductor. In such structures, absorbed light energy creates electron-hole pairs to generate current. Another example of an electrically active structure is a liquid crystal material, which changes its molecular alignment, and therefore its optical properties in response to an external field. Similarly, an electro-optic material can change its optical properties in response to an external field. These electrically active structures are generally disposed between electrodes that collect the generated current or apply the external field.

However, electrode designs commonly used with electrically active structures suffer from a number of disadvantages. For example, conventional solar cells are formed from a current generating structure disposed on a bottom electrode and having a top electrode formed thereon. The top electrode is often formed as a series of wide bus bars with somewhat narrower branches extending between them. The dimensions of these electrodes (e.g., their line widths and the spaces between them) are generally large due to manufacturing cost limitations. The relatively large space between electrodes can create a high series resistance between the current generating sites and the top electrode, leading to inefficient energy collection from the areas of the current generating structure that are farthest from the electrodes. Packing the electrode structures more tightly is not a suitable solution, as a greater amount of electrode material will shield the current generating material from solar radiation, thereby rendering it useless for energy generation. Accordingly, using conventional techniques solar cell designers have to sacrifice efficient current collection in order to avoid blocking too much of the electrically active structure from light, leading to an inefficient use of the current collecting material, and therefore to lower energy generated per unit area. Similarly, liquid crystal and electro-optic devices require at least one electrode to allow a substantial amount of light to interact with the liquid crystal material and its tunable optical properties.

Accordingly, there remains a need for electrode designs that can provide efficient electrical properties (e.g., current collection and field maintenance) while not blocking too much of the electrically active structure from light.

SUMMARY OF THE INVENTION

One aspect of the present invention is an electrical device comprising:
 a first electrode comprising at least one dendritic metal structure;
 a second electrode; and
 an electrically active structure disposed between the dendritic metal structure and the second electrode.

Another aspect of the invention is a method for making an electrical structure comprising a first electrode comprising at least one dendritic metal structure; a second electrode; and an electrically active structure disposed between dendritic metal structure and the second electrode, the method comprising:
 disposing the electrically active structure on the second electrode;
 disposing a solid electrolyte on the electrically active structure;
 disposing an anode comprising a metal, and a cathode in electrical contact with the solid electrolyte; and
 applying a bias voltage across the cathode and the anode sufficient to grow the dendritic metal structure extending from the cathode, the dendritic metal structure being formed from the metal of the anode.

Another aspect of the invention is a method for making an electrical structure comprising a first electrode comprising at least one dendritic metal structure; a second electrode; and an electrically active structure disposed between dendritic metal structure and the second electrode, the method comprising:
 disposing the electrically active structure on the second electrode;
 disposing a solid electrolyte on a transparent substrate;
 disposing an anode comprising a metal, and a cathode in electrical contact with the solid electrolyte;
 applying a bias voltage across the cathode and the anode sufficient to grow the dendritic metal structure extending from the cathode, the dendritic metal structure being formed from the metal of the anode; and
 electrically contacting the dendritic metal structure with the electrically active structure.

Another aspect of the invention is a method for making an electrical structure comprising an electrode, the electrode comprising a dendritic metal structure, the method including:
 applying a bias voltage across an anode and a cathode in electrical contact with a solid electrolyte, the solid electrolyte having metal dissolved therein, the bias voltage being sufficient to grow a dendritic metal structure extending from the cathode, the dendritic metal structure being formed from the metal.

Another aspect of the invention is an electrical device comprising:
 an insulator; and
 an electrode comprising least one dendritic metal structure disposed on the insulator.

Another aspect of the invention is a method for making an electrical device, comprising:
 disposing a solid electrolyte on an insulator;
 disposing an anode comprising a metal, and a cathode in electrical contact with the solid electrolyte; and
 applying a bias voltage across the cathode and the anode sufficient to grow a dendritic metal structure extending from the cathode, the dendritic metal structure being formed from the metal of the anode.

DETAILED DESCRIPTION OF THE INVENTION

Figure 1:
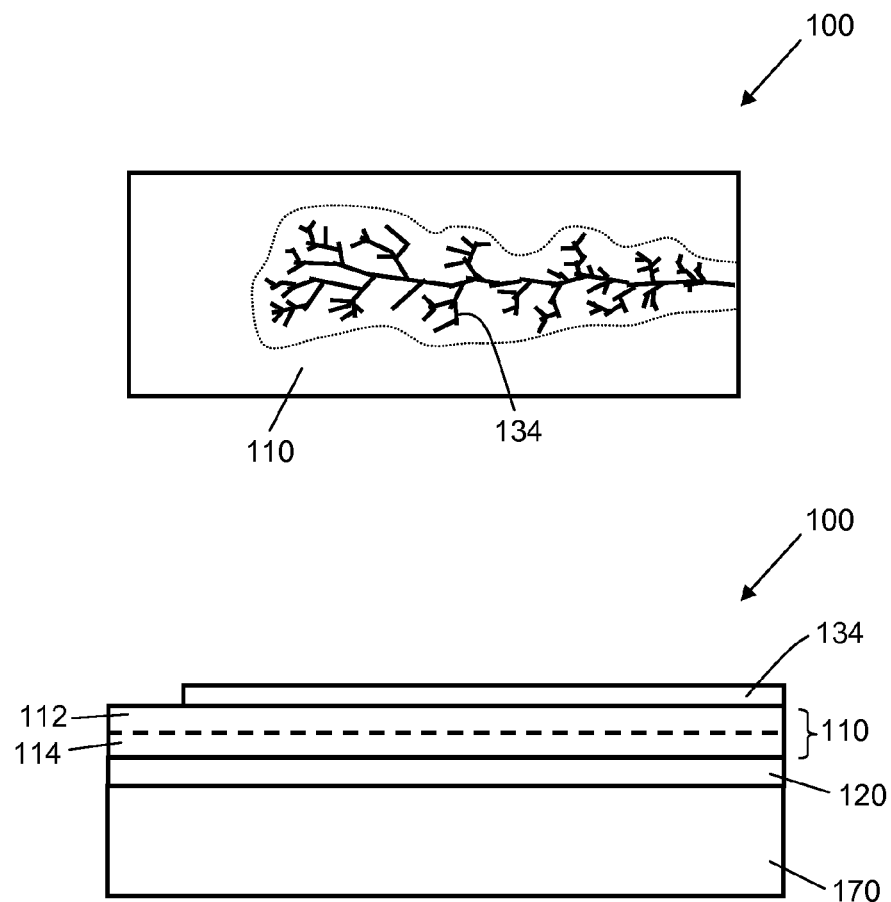
FIG. 1 is a schematic top view and a schematic side cross-sectional view of an electrical device according to one embodiment of the invention.

One example of an electrical device according to one embodiment of the invention is shown in schematic top view and schematic cross-sectional view in FIG. 1. Electrical device 100 includes an electrically active structure 110, in this example a current generating structure including an n-type semiconductor layer 112 and a p-type semiconductor layer 114. On one side of the electrically active structure 110 is a first electrode that includes at least one dendritic metal structure 134. On the other side of the electrically active structure 110 is a second electrode 120 (disposed on substrate 170). In this example, in which the electrically active structure is a current generating structure, the at least one dendritic metal structure and the second electrode are in electrical contact with the current generating structure. In use, generated current (e.g., photogenerated current) runs between the at least one dendritic metal electrode and the second electrode (i.e., in either direction). In other embodiments of the invention, the electrically active structure need not be a current generating structure, and the electrode including the dendritic metal structure and the second electrode need not be in electrical contact with the electrically active structure.

Figure 2:
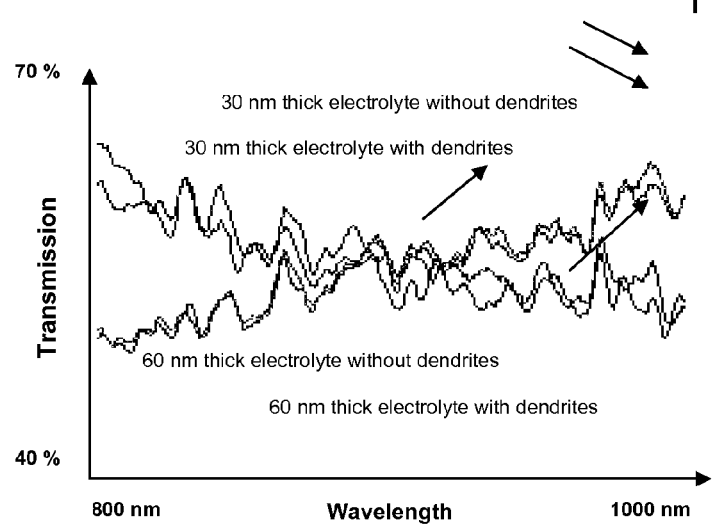
FIG. 2 is a graph showing transmission of electrolyte layers with and without dendrites.

The use of a dendritic metal structure in an electrode can result in a number of advantages. Due to its multi-branched structure, the dendritic metal structure can effectively interact with a large area (e.g., the dotted line shown in FIG. 1) of the electrically active structure without occluding a substantial portion of its area. Accordingly, a dendritic metal structure can provide both reduced resistance current collection and reduced occlusion of underlying layers, making it suitable as a top electrode in electrical devices that photogenerate current, such as solar cells and photodetectors. Dendritic metal structures can also be made to be "nanoscale" in both thickness and width of the individual conducting elements, which allow them to be relatively transparent while covering a large area. For example, as shown in the graph of FIG. 2, the transmission of 30 and 60 nm thick electrolyte films in the wavelength range of 800-1000 nm is not substantially effected by dendrite growth. Moreover, the low optical occlusion and high area coverage of the dendritic metal structure can make them useful as electrodes in field-based optical devices such as liquid crystal devices and electro-optic devices. Moreover, as will be described in more detail below, because the dendritic metal structures can be formed using deposition from a solid electrolyte (instead of a micro- or nanolithographic process), the fabrication of such devices can be relatively simple and therefore of low cost.

The second electrode can be formed as a metallic layer, for example aluminum or copper, disposed on one side of the electrically active structure. The second electrode can be a substantially uniform layer, or can be patterned or masked to provide electrical contact with the electrically active structure only in certain areas. The second electrode can, for example, be disposed on a supporting substrate, or in certain embodiments can itself be the substrate (e.g., when the second electrode is used as an electrical ground as in a liquid crystal based device).

The electrically active structure can take any number of forms. For example, in certain embodiments of the invention, the electrically active structure can be a photocurrent generating layer, such as those used in solar cells and photodetectors. For example, a current generating structure can be formed as a p-n junction as described above. In other embodiments, a current generating structure is formed from cadmium telluride, copper-indium selenide, gallium arsenide, organic semiconductor or silicon-based materials. In certain embodiments, the photocurrent generating layer generates current when illuminated with optical energy having a wavelength greater than about 600 nm. For example, the Ag—Ge—Se materials described herein transmit well in the near-IR, and accordingly can be useful in devices configured as infrared detectors and imagers.

In other embodiments, the electrically active structure changes its optical properties in response to an applied field, with the first electrode including the dendritic metal structure and the second electrode are configured to apply the field to the electrically active structure. The electrically active structure can be, for example, an electro-optic material such as lithium niobate, or a liquid crystal material. In certain embodiments, the photocurrent generating layer generates current when illuminated with optical energy having a wavelength greater than about 600 nm (e.g., in the red, near-infrared, or infrared ranges of the optical spectrum).

In certain embodiments of the invention, the dendritic metal structure and the second electrode are separated by less than about 100 µm, less than about 50 µm, or even less than about 25 µm. In such devices, acceptable field strengths can be achieved with relatively low voltages when used with electro-optic materials. Similarly, efficient generation and collection of current can be achieved when used with current generating structures.

Figure 3:
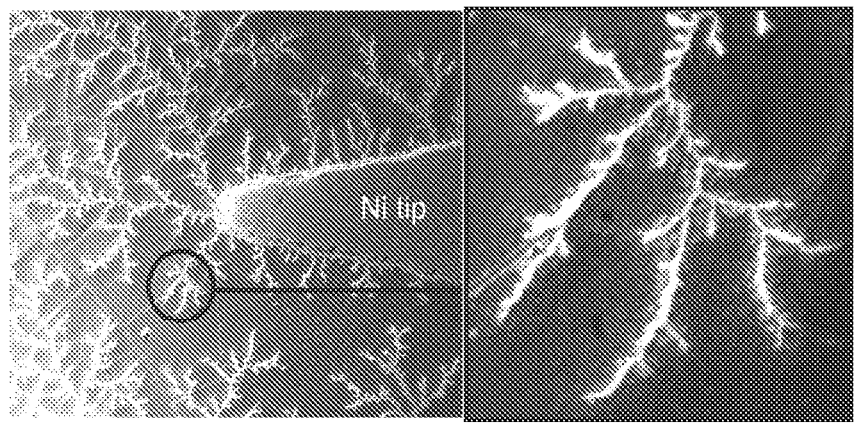
FIG. 3 is a photomicrograph of an example of a dendritic metal structure according to one embodiment of the invention.
Figure 4:
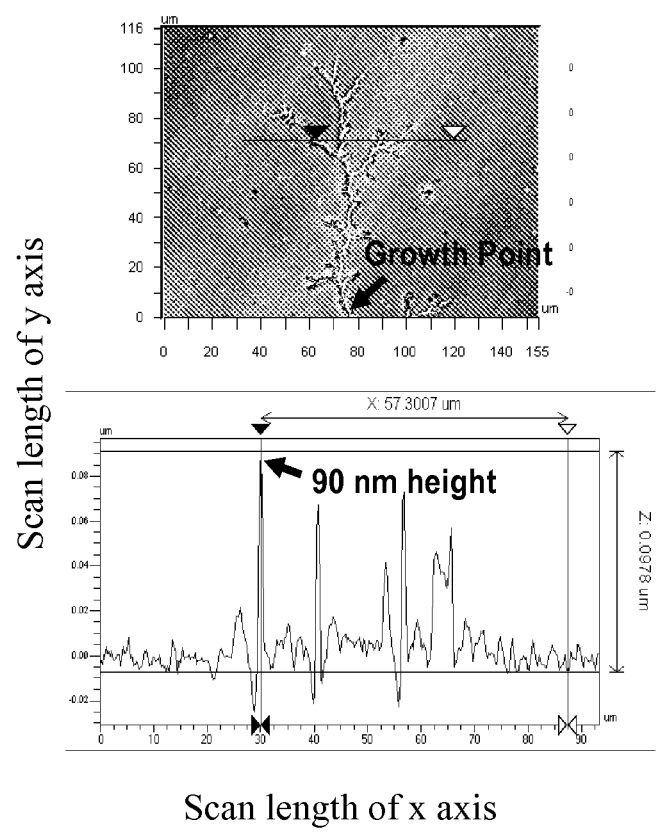
FIG. 4 is a profilometry measurement of another example of a dendritic metal structure according to another embodiment of the invention.

A photomicrograph of an example of a dendritic metal structure is shown in FIG. 3, in which dendritic silver structures are grown from a nickel cathode. FIG. 4 is a profilometry measurement of another example of a dendritic metal structure. A dendritic metal structure has a multi-branched structure formed of segments of reduced ionic material. In certain embodiments of the invention, the at least one dendritic metal structure has an average individual segment width (i.e., in the plane of the dendritic metal structure) of no more than about 300 μm, no more than about 10 μm, no more than about 1 μm, or even no more than about 200 nm. In certain such embodiments, the at least one dendritic metal structure has an average individual segment width of at least about 20 nm. In one embodiment, the dendritic metal structure has an average thickness (i.e., normal to the plane of the dendritic metal structure) of no more than about 5 μm, no more than about 500 nm, no more than about 200 nm, or even no more than about 50 nm. In certain such embodiments, the at least one dendritic metal structure has an average thickness of at least about 10 nm.

The dendritic metal structure can be formed from a variety of metallic materials. For example, in one embodiment of the invention, the dendritic metal structure is formed from silver. Dendritic metal structures can also be formed, for example, from copper, or from zinc or iron.

Dendritic metal structures can be formed by deposition from a solid electrolyte. In certain embodiments, the solid electrolyte contains silver ions; such materials tend to have high ion mobility and can be less difficult to make than alkali metal solid electrolytes. Silver is also well-suited for electrode growth applications due to its mobility and ease of both reduction and oxidation. In another embodiment, copper-containing solid electrolytes can be used to form dendritic copper structures.

The layer of solid electrolyte can be, for example, a metal-containing chalcogenide (i.e., containing oxygen, sulfur, selenium, tellurium) glass. Chalcogenide glasses can be formed with a wide range of physical characteristics and can be made using a variety of techniques, such as physical vapor deposition, chemical vapor deposition, spin casting and melt quenching. Stable binary glasses can, for example, include a Group IV or Group V element, such as germanium or arsenic, with a wide range of atomic ratios possible. The bandgaps of the chalcogenide glasses range from about 1-3 eV for telluride, selenide and sulfide glasses, to 5-10 eV for the oxide glasses. The non-oxide glasses are typically more flexible than oxide glasses. Such structural flexibility can result in the formation of voids through which ions can readily move from one equilibrium position to another. The addition of metallic elements such as silver or copper transforms the chalcogenide glass into an electrolyte, as they can form mobile cations within the material. In one embodiment, the solid electrolyte is Ag-doped $Ge_{30}S_{70}$. Of course, in other embodiments, a different material can be used as the solid electrolyte. For example, silver- or copper-doped oxide glasses such as $SiO_2$ or transition metal oxides can be used in harsher operating environments. Such glasses can provide higher transmission over the visible wavelength range, but may provide slower dendrite growth due to lower ion mobility.

In one embodiment, the chalcogenide glass is a germanium chalcogenide glass. Germanium chalcogenides have relatively low coulombic energies and relatively low activation energies for ion transport. The germanium chalcogenide is desirably glassy in nature; ion conductivity can often be greater in glassy materials than in the corresponding crystalline materials. Of course, crystalline or semi-crystalline materials can also be used. Germanium chalcogenides also tend to be relatively soft materials, making them suitable for use in certain methods in which the dendritic metal structure is formed, annealed or otherwise moved to the interface between the solid electrolyte and the electrically active structure, as described in more detail below. Germanium chalcogenides are also relatively flexible, and can be used on flexible devices. Accordingly, in one embodiment of the invention, the electrical device is flexible. These mechanical properties of the germanium chalcogenides also help avoid cracking during thermal expansion and mechanical stress during use.

In certain embodiments, the solid electrolyte is a solid solution of $As_xS_{1-x}$—Ag, $Ge_xSe_{1-x}$—Ag, $Ge_xS_{1-x}$—Ag, $Ge_xSe_{1-x}$—Cu, $Ge_xS_{1-x}$—Cu, where x ranges from about 0.1 to about 0.5, other chalcogenide materials incorporating silver, copper, zinc, iron, combinations of these materials, Ag- and Cu-doped transition metal oxides, Ag- and Cu-doped silicon or germanium oxides, and the like. Photodissolution techniques can be used to load metal and/or metal ions into the solid electrolyte.

In accordance with one particular embodiment of the invention, the solid electrolyte includes a germanium-selenide glass with about 10 to about 50 atomic percent silver diffused in the glass (e.g., $Ag_{33}Ge_{20}Se_{47}$). Such materials can be formed using evaporation. Additional solid electrolyte materials and methods of forming them are discussed in U.S. Pat. No. 6,635,914, which is hereby incorporated herein by reference in its entirety. In one example of the fabrication of the solid electrolyte, a 50 nm layer of $Ge_{0.20-0.40}Se_{0.60-0.82}$ is first deposited onto the surface of the electrically active structure, and the Ge—Se layer is covered with about 20 nm of silver. The silver is dissolved into the Ge—Se glass by exposing the silver to a light source having a wavelength of about 405 nm and a power density of about 5 mW/cm$^2$ for about ten minutes. Any excess silver is then removed using a $Fe(NO_3)_3$ solution. The solid electrolyte material is then patterned and etched using RIE etching (e.g., $CF_4+O_2$) or wet etching (e.g., using NaOH:IPA:DI).

Of course, other electrolyte materials can be used in the present invention. As suggested above, tellurides (e.g., doped germanium tellurides) can also be used in certain embodiments of the invention. In other embodiments of the invention, the solid electrolyte is a metal (e.g., copper) doped transition metal oxide.

The layer of solid electrolyte can have a thickness, for example, in the range of about 1 nm to about 1 μm. In certain embodiments, the layer of solid electrolyte has a thickness in the range of about 5 nm to about 100 nm.

In certain embodiments, the solid electrolyte has a thickness less than about 10 nm. For example, the solid electrolyte can have a thickness in the range of about 1 nm to about 10 nm. In cases where the solid electrolyte is not of high transmissivity at desired wavelengths, use of thinner solid electrolyte layers can improve overall transmission to the electrically-active layer. Such solid electrolyte layers need not be completely continuous on the micro-/nanoscale, as reduced sheet resistance can be achieved even with discontinuous dendrites. Moreover, thinner solid electrolyte layers can be more flexible, allowing for increased process flexibility and growth of materials underneath the solid electrolyte, as described in more detail below with respect to FIG. 7.

An anode and a cathode can be formed in contact with the solid electrolyte so that the dendritic metal structure can be electrodeposited. In the process of electrodeposition, metal cations in the electrolyte are reduced at the cathode. To replace the metal cations in the electrolyte and allow for continued growth of the dendritic metal structure, the anode can comprise the same metal as the metal of the dendritic metal structure and the solid electrolyte. As the dendritic metal structure grows by reduction at the cathode, the anode is concomitantly oxidized and dissolved into the solid electrolyte, resulting in a net mass transfer from the anode to the growing dendritic metal structure. For example, the anode can be formed of silver, a silver alloy, copper or a copper alloy. In other embodiments, the anode need not dissolve into the solid electrolyte, and the dendritic metal structures can be grown only from the metal initially dissolved into the solid electrolyte. For example, the anode can be relatively inert, as described below with respect to the cathode.

The cathode can be relatively inert and generally does not dissolve during the electrodeposition operation. For example, the cathode can be formed from an inert material such as aluminum, tungsten, nickel, molybdenum, platinum, gold, chromium, palladium, metal silicides, metal nitrides, and doped silicon. In such embodiments. Moreover, the bias can be reversed to redissolve metal from the dendritic structures, thereby providing a method to more precisely tune the extent of dendrite growth. Of course, in other embodiments, the cathode need not be formed from an inert material. Indeed, when both electrodes are formed from the metal of the dendritic metal structures, either electrode can act as the anode from which the dendritic metal structures grow, providing additional process flexibility. The person of skill in the art can select appropriate cathode materials based on the necessary electrodeposition conditions. Various configurations of solid electrolyte and electrodes suitable for use with the present invention are discussed, for example, in U.S. Pat. No. 6,635,914, which is hereby incorporated herein by reference in its entirety.

Contacts may suitably be electrically coupled to the anode and/or cathode to facilitate forming electrical contact to the respective electrode. The contacts may be formed of any conductive material and are preferably formed of a metal such as aluminum, aluminum alloys, tungsten, or copper.

In one embodiment of the invention, when a sufficient bias (e.g., a hundred mV or more) is applied across the anode and the cathode, metallic ions (e.g., $Ag^+$) to move from the anode (in this example, made of silver) and/or from metal dissolved in the solid electrolyte toward the cathode. Metallic ions at the cathode are reduced to form the dendritic metal structure, which grows and extends from the cathode out onto the solid electrolyte. The amount of electrodeposited material is determined by factors such as the applied voltage, the identity of the metal (here, silver), the ion current magnitude and the time during which the current is allowed to flow. The dendritic metal structure can be deposited within or on the layer of solid electrolyte as an increased concentration of reduced metal compared to the concentration of such material in the bulk solid electrolyte material. Electrodeposits can have significant growth parallel to as well as normal to the solid electrolyte surface. The applied bias can be, for example, in the range of 200 mV to 20 V, but the person of skill in the art will appreciate that other bias strengths can be used.

As in any plating operation, the ions nearest the electron-supplying cathode will generally be reduced first. However, in real-world devices in which the nanoscale roughness of the electrodes is significant and the fields are relatively high, statistical non-uniformities in the ion concentration and in the electrode topography will tend to promote localized deposition or nucleation rather than blanket plating. Even if multiple nuclei are formed, the ones with the highest field and best ion supply will be favored for subsequent growth, extending out from the cathode as individual elongated metallic features. The deposition interface continually moves toward the anode, increasing the field and thereby speeding the overall growth rate of the electrodeposit.

Figure 5:
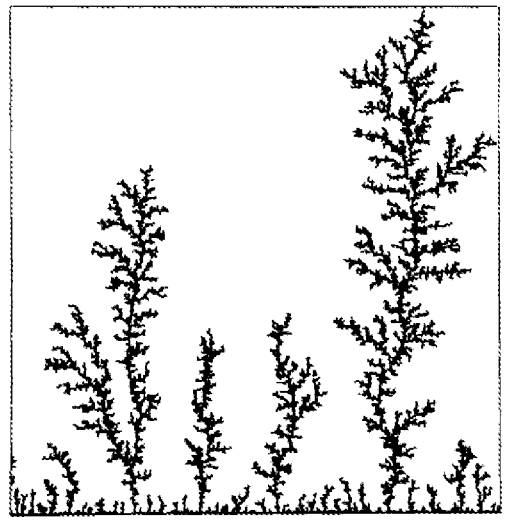
FIG. 5 is a top view of dendritic metal structures grown between parallel electrodes.

While not intending to be limited by theory, the inventor surmises that the addition of new atoms to the growing electrodeposit occurs through a diffusion-limited aggregation mechanism. In this growth process, an immobile "seed" is fixed on a plane in which particles are randomly moving. Particles that move close enough to the seed in order to be attracted to it attach and form the aggregate. When the aggregate consists of multiple particles, growth proceeds outwards and with greater speed as the new deposits extend to capture more moving particles. Thus, the branches of the core clusters grow faster than the interior regions. The precise morphology depends on parameter such as the potential difference and the concentration of ions in the electrolyte. For high ion concentrations and high fields as are common in the devices described herein, the moving ions have a strong directional component, and dendrite formation occurs. The dendrites have a branched structure, but grow along a preferred axis largely defined by the applied electric field. For example, FIG. 5 shows dendritic metal structures grown between parallel electrodes (i.e., an anode at the top of the figure and a cathode at the bottom of the figure).

Figure 6:
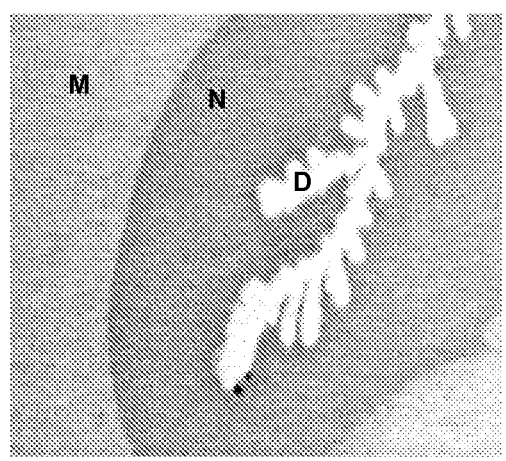
FIG. 6 is a photomicrograph of a silver dendrite disposed on an underdoped region of solid electrolyte.

Dendrite growth causes a mass transfer of metal from the solid electrolyte to the growing dendrite. For example, when the solid electrolyte has a metallic sheen due to excess metal, dendrite growth can transfer that metal to the dendrite, thereby increasing the apparent transmission of the solid electrolyte. When the solid electrolyte is not replenished with metal (e.g., by a sacrificial electrode), dendrite growth can significantly deplete the solid electrolyte of metal. Depletion of metal in the solid electrolyte can also occur when metal dissolves into the solid electrolyte from the anode much more slowly than it is plated on the dendritic metal structures. Accordingly, the area of the electrolyte surrounding the dendritic metal structures can become underdoped. For example, FIG. 6 is a photomicrograph of a silver dendrite grown on a 10 nm thick layer of silver-doped germanium selenide glass. Growth of the dendrite (D) has depleted the region (N) of the solid electrolyte around the dendrite of silver, as compared to the region (M) farther from the dendrite. Depletion of metal from the solid electrolyte can increase the optical bandgap of the doped solid electrolyte, and therefore increase transmission at shorter wavelengths. For example, the optical bandgap for undoped $Ge_3Se_7$ is 2.1 eV, which decreases with silver doping, producing a dark orange tint in thicker films. Removal of silver from the film can drive the band edge further toward the ultraviolet, allowing greater transmission of visible light. In some material systems, however, metal from the dendritic metal structure will slowly dissolve into underdoped solid electrolyte (e.g., upon exposure to light), thereby reducing device stability over time.

Accordingly, one embodiment of the invention is a method for making an electrical structure comprising a first electrode comprising at least one dendritic metal structure; a second electrode; and an electrically active structure disposed between dendritic metal structure and the second electrode, the method, the method including disposing the electrically active structure on the second electrode; disposing a solid electrolyte on the electrically active structure; disposing an anode including a metal, and a cathode in electrical contact with the solid electrolyte; and applying a bias voltage across the cathode and the anode sufficient to grow the dendritic metal structure extending from the cathode, the dendritic metal structure being formed from the metal of the anode. In certain embodiments of the invention, the bias voltage is in the range of 200 mV to 20 V, depending on the particular materials and configurations used.

In one embodiment of the invention, the device includes one or more barrier layers, for example between the anode and the solid electrolyte and/or between the cathode and the solid electrolyte. Optional barrier layers can include a material that restricts migration of ions and/or that affects the threshold voltage required to form the electrodeposit. In accordance with certain embodiments of the invention, a barrier layer includes conducting material such as titanium nitride, titanium tungstide, a combination thereof, or the like. Use of a conducting barrier layer between the cathode and the solid electrolyte allows for the cathode to be formed of oxidizable material because the barrier prevents diffusion of the electrode material to the ion conductor. The diffusion barrier may also serve to prevent undesired electrodeposit growth within a portion of the structure. In other embodiments of the invention, the barrier material includes an insulating material. Inclusion of an insulating material increases the voltage required to electrodeposit the dendritic metallic structures, which can in some embodiments help to avoid undesired growth.

In certain embodiments, for example in the case of a coplanar anode and cathode formed on the surface of the solid electrolyte, the dendritic metal structures can fours on the surface of the solid electrolyte with little subsurface penetration. The electrodeposition process can cause growth in the direction normal to the surface, creating dendritic metal structures of substantial thickness (e.g., in the range of 50 nm-500 nm, or even 100 nm-500 nm).

Growth rates will depend on the ion flux per unit area. Lateral growth rates can be, for example, in the range of 1-50 µm/s.

The resistance of a dendritic metal structure depends on the conductivity of the metal and the length and cross-sectional area of the structure. The conductivity of silver structures with features having height and width in the few tens of nanometers is $5 \times 10^5$ S/cm. For a single silver structure that is 1 mm in length, 10 µm wide and 20 nm thick, the resistance is about 100Ω. While this value may appear high, in use there will be multiple branches and/or multiple dendritic metal structures, so that the net resistance will be a series-parallel combination of all individual resistances, and therefore will be much, much lower (e.g., on the order of a few Ω). The dendritic metal structures greatly reduce the apparent overall sheet resistance of the solid electrolyte layer, even if the growth is not continuous. That is, the dendrites do not have to join together or join with other electrodes to lower the overall sheet resistance.

Figure 7:
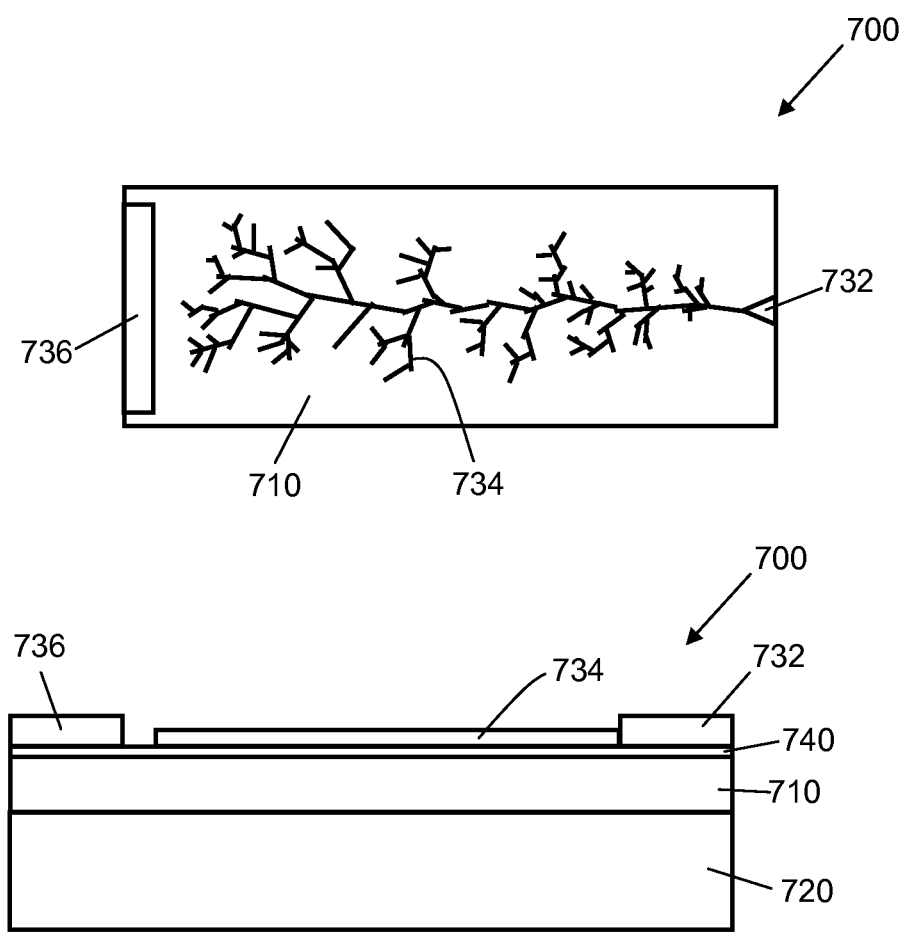
FIG. 7 is a schematic side cross-sectional view and a schematic top view of an electrical device according to another embodiment of the invention.

Accordingly, another embodiment of the invention is shown in schematic cross-sectional and schematic top view in FIG. 7. Electrical device 700 includes an electrically active structure 510 disposed on second electrode 720. Solid electrolyte 740 is disposed on electrically active structure 710, with cathode 732 and anode 736 disposed thereon. In one embodiment, the anode and the cathode are coplanar and parallel. In other embodiments, the anode and the cathode can be configured in other geometries (e.g., concentric, triangular). The cathode can, for example, be shaped or textured to promote nucleation and growth at particular points along its length (using, for example, a sawtooth shape). Dendritic metal structures 734 extend from cathode 732 toward anode 736. The cathode 732 and the dendritic metal structures 734 act as the top electrode of the electrical device 700; the cathode can act as a bus bar and provide an area for electrical contact to a circuit for the collection of generated current.

Figure 8:
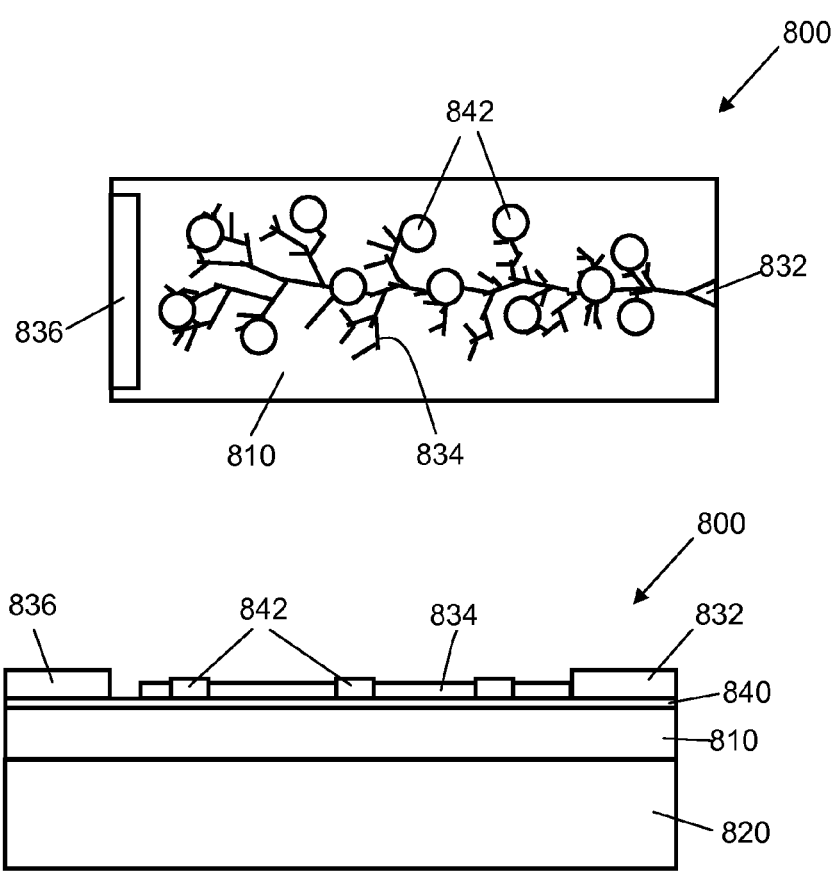
FIG. 8 is a schematic side cross-sectional view and a schematic top view of an electrical device according to another embodiment of the invention.

Similarly, the embodiment of FIG. 7 can be modified to include a thin (e.g., less than 5 nm thick) layer of metal (e.g., silver) on top of the solid electrolyte. Accordingly, another embodiment of the invention is shown in schematic cross-sectional and schematic top view in FIG. 8. Electrical device 800 includes an electrically active structure 810 disposed on second electrode 820. Solid electrolyte 840 is disposed on electrically active structure 810, with cathode 832 and anode 836 disposed thereon. A metal layer (e.g., silver) is disposed on the solid electrolyte 840. Silver layers a few nm thick tend to form as discontinuous islands 842 than as a continuous film. Dendritic metal structures 834 extend from cathode 832 toward anode 836, interconnecting the islands 842. The cathode 832, the islands 842 and the dendritic metal structures 834 act as the top electrode of the electrical device 800; the cathode can act as a bus bar and provide an area for electrical contact to a circuit for the collection of generated current.

Figure 9:
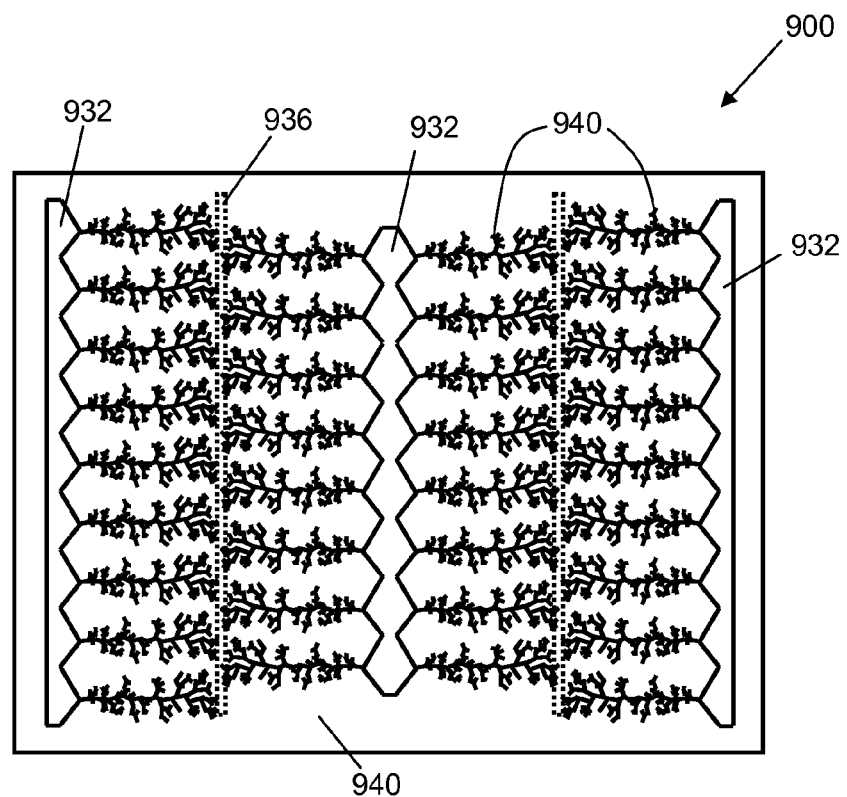
FIG. 9 is a schematic top view of an electrical device according to another embodiment of the invention.

Another embodiment is shown in schematic top view in FIG. 9. In this embodiment, the anode is sacrificial, and is substantially completely consumed during the electrodeposition process. Cathodes 932 are formed on top of solid electrolyte 940, with sacrificial anodes 936 (shown in dotted line outline) formed therebetween. Dendritic metal structures 934 extend from cathodes 932 toward the original positions of anodes 936 (which can be substantially consumed during electrodeposition of the dendritic metal structures). The person of skill in the art can determine the size and thickness of a sacrificial anode that provides the desired dendritic metal structure growth.

In these embodiments, very finely structured electrodes can be advantageously formed without the use of micro- or nanolithographic techniques, leading to significant cost and throughput advantages in fabrication.

Another advantage according to certain embodiments of the invention is that when the solid electrolyte and anode are retained as part of the electrical device, it is possible for the electrodeposited dendritic metal structures to continue to grow during operation. When the electrically active structure is a photovoltaic material, the current supplied thereby can produce voltage drops across high resistance regions, which can be used to stimulate electrodeposition in such regions. An external bias (e.g., similar to that used to originally grow the dendrites) can also be supplied to stimulate electrodeposition in situ. Electrodeposition can continue until the local bias drops below the electrodeposition threshold. High resistance regions can exist, for example, in damaged sections of the dendritic metal structure, in which case the in situ operational growth can be used to self-repair the structure. High resistance regions can also exist in areas that are not efficiently coupled to an existing dendritic metal structure; the operation of the device can adaptively supply additional dendritic metal structure in such areas. Damage to the dendritic metal structures caused by, for example, thinning at topographical features, stress during packaging, temperature or mechanical shock in the field, can be repaired thereby, Self-healing of dendritic metal structures is described in more detail in U.S. Pat. No. 6,388,324, which is hereby incorporated herein by reference in its entirety.

In certain embodiments of the invention, the region of the solid electrolyte disposed directly beneath the dendritic metal structure has an increased concentration of metal. Such devices can be formed by partially dissolving metal from the dendritic metal structure into the solid electrolyte. These regions of higher metal concentration can improve electrical contact between the dendritic metal structure and the electrically active structure (e.g., a current generating structure). Thermally- or optically induced (e.g., UV light) diffusion can be used to dissolve metal into the areas beneath the dendritic metal structure. For example, optical treatment can be performed, for example, using a wavelength range of about 365-436 nm at about 1-100 mW/cm² for a time in the range of about 5-100 minutes. Thermal treatments can be performed, for example, in a neutral ambient (e.g., $N_2$ or Ar) for about 1-100 minutes at temperatures in the range of about 100-200° C. (e.g., for selenide electrolytes), about 100-350° C. (e.g., for sulfide electrolytes), or about 100-600° C. (e.g., for oxide electrolytes). The thermally- or optically-induced diffusion can produce a region of the solid electrolyte having at least 50 atom % or even at least 70 atom % metal. In other embodiments of the invention, mechanical pressure can be used to force the dendritic metal structures into closer contact with the electrically active structure. In such embodiments, germanium chalcogenides are particularly suitable for use, as they tend to be relatively soft. For example, pressures in the range of 5-100 kg/cm$^2$ for times in the range of 5-100 can be used to force the dendritic metal structures into closer contact with the electrically active structure. The solid electrolyte need not be very thick (e.g., films as thin as 10 nm can support surface electrodeposition), so diffused or impressed metal need not travel very far to achieve improved electrical contact with the electrically active structure. Of course, in other embodiments of the invention the region of the solid electrolyte disposed directly beneath the dendritic metal structure need not have an increased concentration of metal. The solid electrolyte can be provided as a thin layer, and thus provide little resistance between the dendritic metal structure and the electrically active structure.

In certain embodiments of the invention, the dendritic metal structure is disposed at the interface between the electrically active structure and the solid electrolyte. For example, in the embodiment shown in schematic side cross-sectional view in FIG. 10, electrical device 1000 includes a cathode 1032 disposed at the interface between the electrically active structure 1010 (on second electrode/substrate 1020) and the solid electrolyte 1040. A sacrificial anode 1046 is positioned, for example, on top of the solid electrolyte. To prevent any deposition on top of the solid electrolyte, a growth retarding layer 1050 (e.g., a hard oxide layer chemically bound to or oxidatively grown from the top of the electrolyte layer) can be formed thereon. A dendritic metal structure 1034 can be formed at the interface between the solid electrolyte and the electrically active structure by the application of a bias. In certain embodiments, the solid electrolyte is a relatively soft glass (e.g., a germanium chalcogenide such as silver-doped germanium arsenide or selenide), which can deform slightly to allow the dendritic metal structure to grow at the interface. In such embodiments, the dendritic metal structure can have good electrical contact with the electrically active structure, as there is substantially no solid electrolyte disposed therebetween.

Figure 10:
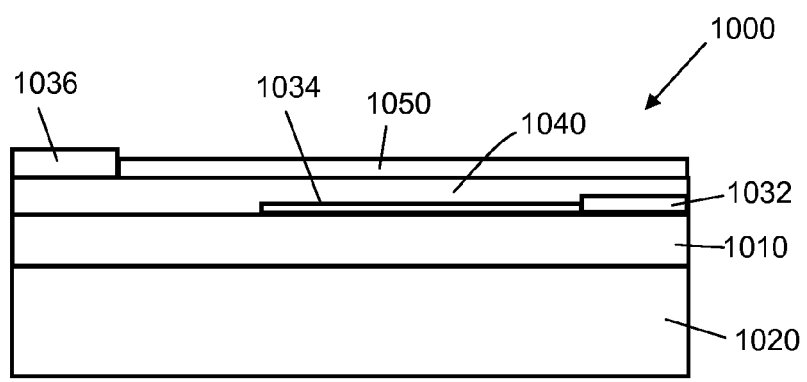
FIG. 10 is a schematic side cross-sectional view of an electrical device according to another embodiment of the invention.

Similarly, the embodiment of FIG. 10 can be modified to include a thin (e.g., less than 5 nm thick) layer of metal (e.g., silver) between the solid electrolyte and the electrically active layer. Silver layers a few nm thick tend to form as discontinuous islands rather than as a continuous film. Dendrite growth can connect the discontinuous islands, thereby forming a transparent electrode with low sheet resistance. Any breaks in the connectivity can be self-healed by an applied voltage, as described above.

In certain embodiments of the invention, an insulating layer is disposed between the solid electrolyte and the electrically active structure. An insulating layer can be suitable for use with a conductive electrically active structure. When the electrically active structure is not substantially less conductive than the solid electrolyte, the bias applied across the anode and cathode for electrodeposition can cause current flow through the electrically active structure instead of through the solid electrolyte, thereby greatly reducing the speed of electrodeposition. In certain embodiments in which an insulating layer is disposed between the electrically active structure and the solid electrolyte, an annealing process can be used to drive the dendritic metal structure through the insulating layer so that it makes contact with the underlying electrically active structure. Alternatively, heat and pressure can be used to force the dendritic metal structure at least partially through the insulating layer. In certain embodiments, the insulating layer can be removed (e.g., by an etch process) to allow electrical contact between the dendritic metal structure and the electrically active structure. Such embodiments are especially suitable for use when the electrically active structure is a current generating structure. In embodiments in which the electrically active structure need not be in electrical contact with the electrically active structure (e.g., in embodiments using electro-optic materials), the insulating layer can help to prevent short circuiting.

In certain embodiments, the device does not include a continuous solid electrolyte layer. For example, the electrolyte can be removed in at least the area of the dendritic metal structures. In certain embodiments, the solid electrolyte directly supporting the dendritic metal structures is not etched; the person of skill in the art can select solid electrolyte thicknesses and etch conditions to prevent undercutting of the dendritic metal structures. In some embodiments, the dendritic metal structures can be undercut and deposit onto the underlying layer (e.g. the electrically active structure). The bulk of the solid electrolyte layer can be removed after dendrite growth, for example to improve transmission at desired wavelengths (e.g., visible wavelengths) and to avoid redissolution of dendrites back into the solid electrolyte. Germanium chalcogenide materials (as well as the other chalcogenides listed herein) can be selectively etched, for example, with aqueous base or a $CF_4$ plasma. The person of skill in the art can select appropriate reagents and methods for removing other solid electrolyte layers.

Etch selectivity can be greatly improved by allowing the electrolyte to deliberately become depleted of metal by the growth process itself. The metal-depleted electrolyte will dissolve much more rapidly in an aqueous base (or a $CF_4$ plasma) than heavily doped electrolyte or metal.

Figure 11:
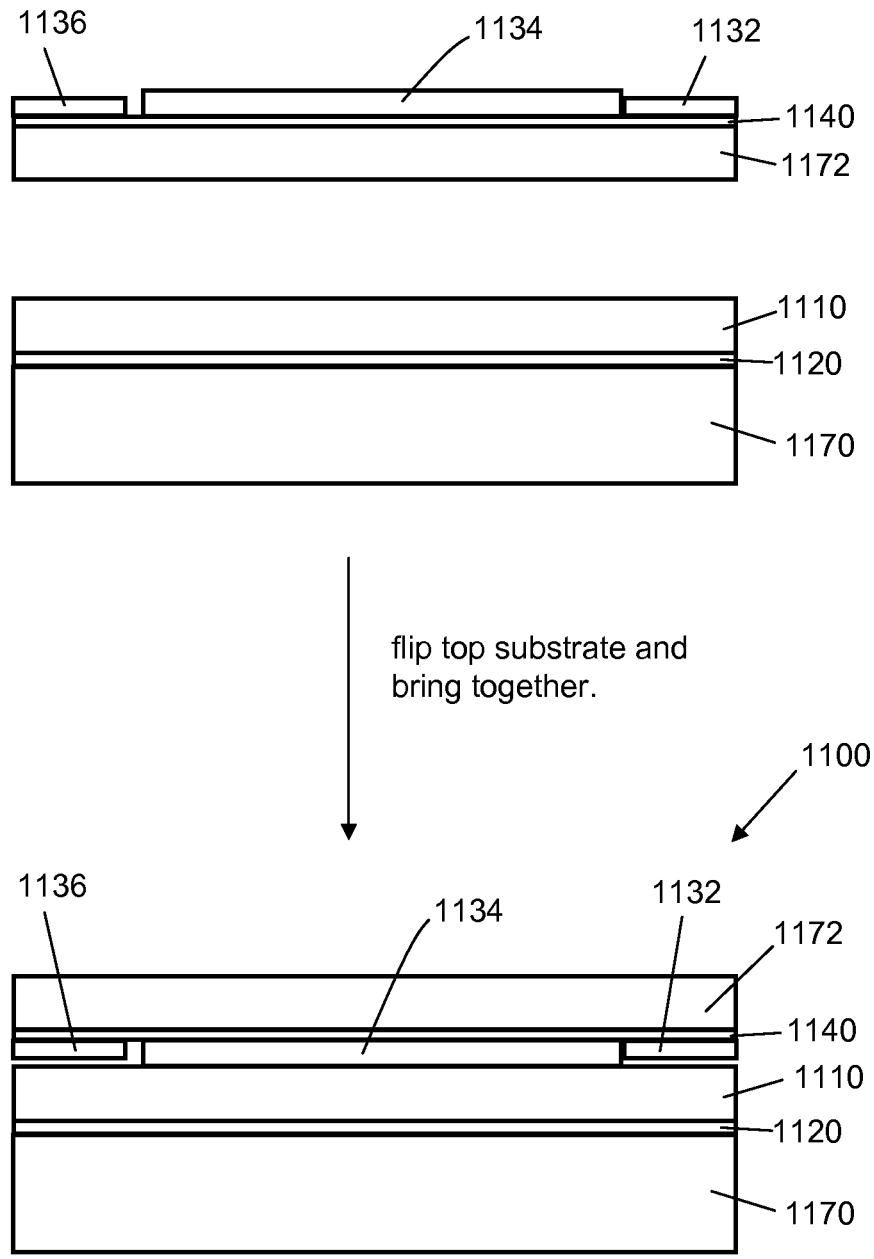
FIG. 11 is a schematic side cross-sectional view of an electrical device and a method of making and electrical device according to another embodiment of the invention.

In other embodiments of the invention, the dendritic metal structure is grown on a separate insulating substrate, then interfaced with the electrically active structure in a subsequent step. The substrate can be substantially transparent, so as to allow light to impinge on the electrically active structure. For example, in one embodiment, shown in FIG. 11, electrical device 1100 includes a base substrate 1170, a second electrode 1120, and an electrically active structure 1110. A dendritic metal structure 1134 is deposited from a cathode 1132 formed on a solid electrolyte 1140 deposited on a transparent insulating substrate 1172. The dendritic metal structure 1134 is then brought into contact with the electrically active structure 1110. In this embodiment, the dendritic metal structure is disposed between the electrically active structure and a solid electrolyte disposed on an insulating substrate. The solid electrolyte layer can be made very thin (e.g., on the order of 1-10 nm, or 10-50 nm), and so will not absorb enough light to significantly effect system performance. The substrate bearing the dendritic metal structure can be affixed to the substrate bearing the electrically active structure using an adhesive; mechanical pressure can also be used to maintain electrical contact between the electrically active structure and the dendritic metal structure.

In some embodiments, the substrate bearing the solid electrolyte and the dendritic metal structure can be removed, for example by etching or disconnection from the solid electrolyte layer. In such embodiments, the substrate need not be transparent. The solid electrolyte layer can then, in some embodiments, be thinned or entirely removed by etching, as described above. In such embodiments however, it can be desirable to join the dendritic metal structure with the underlying device layer, for example through annealing and/or pressure as described above. In fact, with solid electrolyte layers of sufficient thickness, no separate substrate is necessary; the solid electrolyte itself can be tough enough to support the dendritic metal structure through the subsequent process steps.

Accordingly, another aspect of the invention is a method for making an electrical structure comprising a first electrode comprising at least one dendritic metal structure; a second electrode; and an electrically active structure disposed between dendritic metal structure and the second electrode, the method including disposing the electrically active structure on the second electrode; disposing a solid electrolyte on a transparent substrate; disposing an anode including a metal, and a cathode in electrical contact with the solid electrolyte; applying a bias voltage across the cathode and the anode sufficient to grow the dendritic metal structure extending from the cathode, the dendritic metal structure being formed from the metal of the anode; and electrically contacting the dendritic metal structure with the electrically active structure. The method can, for example, be performed substantially as described above.

The methods of the present invention can be performed at room temperature. Accordingly, the resulting dendritic materials can be formed with minimal residual/intrinsic stress, making them particularly well-suited for thin substrate applications (e.g., thin crystalline solar cells) in which the stress inherent in fabricating other conductor systems causes warping.

The person of skill in the art will recognize that the methods described herein can be used to make devices that do not include an electrically active layer. Accordingly, another aspect of the invention is a method for making an electrical structure including an electrode, the electrode including a dendritic metal structure. The method includes applying a bias voltage across an anode and a cathode in electrical contact with a solid electrolyte having metal dissolved therein. The bias voltage is sufficient to grow a dendritic metal structure extending from the cathode and formed from the metal. The metal can, for example, be provided by the anode. For example, in certain embodiments, the anode is made from the metal dissolved in the solid electrolyte, and the metal of the anode dissolves into the solid electrolyte as the dendritic metal structure is grown. In other embodiments, the anode is relatively inert, and the growth of the dendritic metal structure depletes the solid electrolyte of metal, at least in the neighborhood of the dendritic metal structure. The person of skill in the art will recognize that the methods described hereinabove can be adapted to perform the methods according to this aspect of the invention.

In other embodiments of the invention, a dendritic metal structure is formed on the electrically active structure through an imprinting or photolithographic process. For example, a dendritic metal structure can be formed as described above on a separate substrate, then used to generate a photomask for the lithographic patterning of a dendritic metal structure on an electrically active structure. Alternatively, a dendritic metal structure can be used to make a nanoimprint lithography mold, which can then be used to produce dendritic metal structures on electrical devices using nanoimprint lithography.

The electrical devices described above can find use in a number of different applications. For example, in one embodiment of the invention, a solar cell comprises an electrical device as described above, or made by a method as described above. In another embodiment of the invention, a photodetector comprises an electrical device as described above, or made by a method as described above.

Series resistance is an important parameter in solar cells, as a high series resistance will reduce the short circuit current and therefore reduce cell efficiency. The series resistance of a silicon solar cell structure decreases with sheet resistance, and therefore with dendrite growth, but contact (i.e., vertical) resistance is not altered significantly by dendrite growth due to the small contact area of the dendrites. High levels of dendrite growth can, however, ultimately increase series resistance due to dissolution of the electrodes. That is, the material removed from an anode to form extensive dendrite structures can result in a porous or eroded anode with a relatively high resistance. Accordingly, the person of skill in the art can select a degree of dendrite growth and an anode size that provides sufficient properties without unduly degrading the anode. Use of a sacrificial anode to supply the metal can also avoid the problem of anode degradation.

Figure 12:
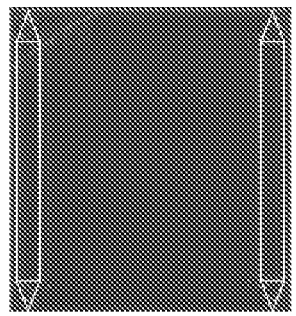
FIG. 12 is a schematic view of three electrode designs used in the solar cell experiments described with respect to Table 1.
Figure 12:
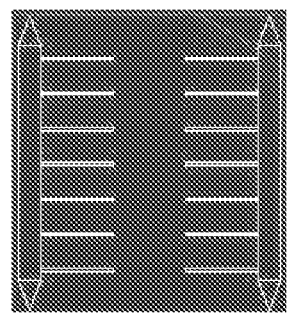
Figure 12:
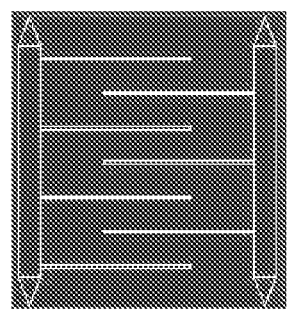

Use of dendritic structures have been shown to decrease the series resistance of solar cells (around 4 cm$^2$, n-type junctions on p-type wafers). Dendritic electrodes were grown from top electrodes in three configurations, open, split-finger and interdigitated-finger, as shown in FIG. 12. The Ag-doped Ge$_3$Se$_7$ electrolyte was 10 nm thick and all surface electrodes were made of silver. The spaces between the bus bars were approximately 20 mm and the vertical spaces between the fingers were 2 mm. The horizontal gap in the finger electrodes was about 4 mm. The dendritic metal structures were grown at 5 V for several minutes. Various electrical parameters were measured under halogen lamp illumination (1 cm$^2$ illuminated area) both before and after dendrite growth. Results are provided in Table 1, below. Notably, the series resistance was reduced and the short circuit current was increased with dendrite growth. These beneficial electrical properties, coupled with the low occlusion of the dendritic structure, can lead to higher solar cell efficiency than conventional electrolyte patterns alone.

TABLE 1

| Configuration | $V_{oc}(V)$ | $I_{sc}(A)$ | $\Delta I_{sc}(\%)$ | $R_s(\Omega)$ | $\Delta R_s(\%)$ |
| --- | --- | --- | --- | --- | --- |
| OPEN w/o dendrites | 0.32 | 0.13 | | 1350 | |
| OPEN w/dendrites | 0.33 | 0.16 | +23 | 1110 | −18 |
| SPLIT FINGERS w/o dendrites | 0.28 | 0.06 | | 3450 | |
| SPLIT FINGERS w/dendrites | 0.28 | 0.17 | +183 | 633 | −82 |
| INTERDIGITATED w/o dendrites | 0.31 | 0.18 | | 589 | |
| INTERDIGITATED w/dendrites | 0.31 | 0.22 | +22 | 495 | −16 |

In another aspect of the invention, an electrical device includes an electrode including dendritic metal structure disposed on an insulator. The dendritic metal structure can be, for example, as described hereinabove. For example, the dendritic metal structure can be formed from silver or copper. In certain embodiments, the at least one dendritic metal structure is no more than about 200 nm in average thickness. In certain embodiments, the at least one dendritic metal structure has an average individual segment width of no more than about 1 μm. In certain embodiments, a solid electrolyte is disposed on the insulator, for example, with the dendritic metal structure disposed on the solid electrolyte. In other embodiments, the dendritic metal structure is disposed between a solid electrolyte and the insulator. The solid electrolyte can be, for example, a germanium chalcogenide glass. The electrode can be electrically coupled to other electrical structures in the device, depending on the function of the device and the electrode therein, as the person of skill in the art would appreciate.

In certain embodiments, the insulator is substantially transparent to visible light (e.g., at least 75% or even at least about 90% averaged over the 400 nm-700 nm wavelength range). In certain devices, such as displays and photodetectors, it is desirable to provide an electrode while maintaining a high light transmission to or from an underlying structure. The use of an electrode comprising a dendritic metal structure as described herein can be especially advantageous when disposed on a transparent insulator, as the combination will allow relatively high transmission to or from an underlying structure, such as a light emitting structure (e.g., an LED, LCD, CRT or plasma display, or a photodetector).

Another aspect of the invention is a method for making an electrical structure as described above. The method includes disposing a solid electrolyte on an insulator; disposing an anode including a metal, and a cathode in electrical contact with the solid electrolyte; and applying a bias voltage across the cathode and the anode sufficient to grow a dendritic metal structure extending from the cathode, the dendritic metal structure being formed from the metal of the anode. Electrical devices can be made by the person of skill in the art using methods analogous to those described hereinabove.

The electrical device can be, for example, a touchscreen, for example a capacitive touchscreen. Conventional touchscreens are particularly susceptible to mechanical stress, which causes the relatively thick and brittle indium tin oxide (ITO) transparent conductor to crack, raising the sheet resistance and reducing sensitivity. The dendritic electrode systems described herein can be made to be flexible and self-healing, and can be used as the top (transparent) electrode of a touchscreen, increasing device lifetime and reliability. Moreover, use of the dendritic electrode systems described herein can be advantaged in that the world's supply of indium is dwindling rapidly, rendering use of ITO more expensive and less sustainable. Accordingly, another aspect of the invention is a touchscreen including an electrical device as described above, or made by a method as described above.

Unless clearly excluded by the context, all embodiments disclosed for one aspect of the invention can be combined with embodiments disclosed for other aspects of the invention, in any suitable combination.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. An electrical device comprising:
    a first electrode comprising at least one dendritic metal structure, wherein the at least one dendritic metal structure has a multi-branched and irregular structure;
    a second electrode; and
    an electrically active structure disposed between the dendritic metal structure and the second electrode;
    wherein a solid electrolyte is disposed on the electrically active structure; wherein the dendritic metal structure is disposed on the solid electrolyte, and wherein the region of the solid electrolyte disposed directly beneath the dendritic metal structure has an increased concentration of metal.

2. The electrical device of claim 1, wherein the electrically active structure is a current generating structure in electrical contact with the second electrode and the electrode comprising the at least one dendritic metal structure.

3. The electrical device according to claim 1, wherein the dendritic metal structure is formed from silver or copper.

4. The electrical device according to claim 1, wherein the at least one dendritic metal structure is no more than about 200 nm in average thickness.

5. The electrical device according to claim 1, wherein the at least one dendritic metal structure has an average individual segment width of no more than about 1 µm.

6. The electrical device according to claim 1, wherein the electrically active structure generates current in response to absorption of light.

7. The electrical device of claim 6, wherein the electrically active structure is a p-n junction.

8. The electrical device according to claim 1, wherein the electrically active structure changes its optical properties in response to an applied field.

9. The electrical device according to claim 1, wherein the dendritic metal structure is disposed at the interface between the electrically active structure and the solid electrolyte.

10. The electrical device according to claim 1, wherein the solid electrolyte is a germanium chalcogenide glass.

11. The electrical device according to claim 1, wherein an insulating layer is disposed between the solid electrolyte and the electrically active structure.

12. The electrical device according to claim 1, wherein the dendritic metal structure is disposed between the electrically active structure and a solid electrolyte disposed on an insulating substrate.

13. A solar cell or a photodetector comprising the electrical device according to claim 1.

14. A method for making an electrical structure;
    wherein the electrical structure comprises a first electrode comprising at least one dendritic metal structure, a second electrode, and an electrically active structure disposed between the dendritic metal structure and the second electrode; the method comprising:
    disposing the electrically active structure on the second electrode;
    disposing a solid electrolyte on the electrically active structure;
    disposing an anode comprising a metal, and a cathode in electrical contact with the solid electrolyte; and
    applying a bias voltage across the cathode and the anode sufficient to grow the dendritic metal structure extending from the cathode, the dendritic metal structure being formed from the metal of the anode.

15. A method for making an electrical structure;
    wherein the electrical structure comprises a first electrode comprising at least one dendritic metal structure, a second electrode, and an electrically active structure disposed between the dendritic metal structure and the second electrode; the method comprising:
    disposing the electrically active structure on the second electrode;
    disposing a solid electrolyte on a transparent substrate;
    disposing an anode comprising a metal, and a cathode in electrical contact with the solid electrolyte;
    applying a bias voltage across the cathode and the anode sufficient to grow the dendritic metal structure extending from the cathode, the dendritic metal structure being formed from the metal of the anode; and
    electrically contacting the dendritic metal structure with the electrically active structure.

16. A method for making an electrical device;
wherein the electrical device comprises an insulator, and an electrode comprising at least one dendritic structure disposed on the insulator; the method comprising:
disposing a solid electrolyte on the insulator;
disposing an anode comprising a metal, and a cathode in electrical contact with the solid electrolyte; and
applying a bias voltage across the cathode and the anode sufficient to grow the dendritic metal structure extending from the cathode, the dendritic metal structure being formed from the metal of the anode.

* * * * *